(12) United States Patent
Saloio et al.

(10) Patent No.: US 9,391,630 B2
(45) Date of Patent: Jul. 12, 2016

(54) MULTIPLEXED SIGNAL SAMPLER AND CONDITIONER

(71) Applicant: Hamilton Sundstrand Corporation, Windsor Locks, CT (US)

(72) Inventors: James Saloio, Ludlow, MA (US); Kanwalpreet Reen, Bristol, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 0 days.

(21) Appl. No.: 14/303,733

(22) Filed: Jun. 13, 2014

(65) Prior Publication Data

US 2015/0365099 A1     Dec. 17, 2015

(51) Int. Cl.
    *H03M 1/12*     (2006.01)
    *G01D 5/22*     (2006.01)

(52) U.S. Cl.
    CPC .............. *H03M 1/122* (2013.01); *G01D 5/2291* (2013.01)

(58) Field of Classification Search
    CPC .......... G01D 5/20–5/243; H03M 1/205–1/225
    USPC .......................................... 341/111–117, 141
    See application file for complete search history.

(56) References Cited

U.S. PATENT DOCUMENTS

| | | | |
|---|---|---|---|
| 3,516,084 A | 6/1970 | Sacks et al. | |
| 3,829,854 A * | 8/1974 | Brand et al. | 341/116 |
| 3,976,869 A | 8/1976 | Stella et al. | |
| 4,062,005 A | 12/1977 | Freed et al. | |
| 4,099,245 A | 7/1978 | Maysonett | |
| 4,542,336 A | 9/1985 | Powell | |
| 4,594,540 A | 6/1986 | Currie et al. | |
| 4,651,130 A | 3/1987 | Pennell | |
| 4,652,821 A | 3/1987 | Kreft | |
| 4,656,585 A | 4/1987 | Stephenson | |
| 5,134,397 A | 7/1992 | Eyerly et al. | |
| 5,134,404 A * | 7/1992 | Peterson | 341/116 |
| 5,168,222 A | 12/1992 | Volsin et al. | |
| 5,180,932 A | 1/1993 | Bengel | |
| 5,241,268 A | 8/1993 | Lee | |
| 5,260,650 A | 11/1993 | Schwesig et al. | |
| 5,463,393 A * | 10/1995 | Havlicsek | 341/115 |
| 5,600,576 A | 2/1997 | Broadwater et al. | |

(Continued)

FOREIGN PATENT DOCUMENTS

| | | |
|---|---|---|
| JP | 6338798 | 12/1994 |
| JP | 2000037031 | 2/2000 |

(Continued)

OTHER PUBLICATIONS

European Search Report for European Application No. 15171660.2 completed Nov. 9, 2015.

*Primary Examiner* — Howard Williams
(74) *Attorney, Agent, or Firm* — Carlson, Gaskey & Olds, PC

(57) ABSTRACT

A signal convertor includes a first sensor configured to generate a first signal and a second signal and first and second multiplexers configured receive the first and second signals, respectively, and generate samples. The signal convertor also includes an analog-to-digital (A/D) convertor configured to convert the samples and a processor configured to multiply the samples by a sine vector and by a cosine vector and determine a magnitude of the first and second signals based upon the product of the samples and the sine vector and the product of the samples and the cosine vector. A method for converting a signal is also disclosed.

20 Claims, 10 Drawing Sheets

(56) References Cited

U.S. PATENT DOCUMENTS

| | | |
|---|---|---|
| 6,014,022 A | 1/2000 | Demma et al. |
| 6,084,376 A | 7/2000 | Piedl et al. |
| 6,331,759 B1 | 12/2001 | Atmur |
| 6,697,006 B1 | 2/2004 | McCartney et al. |
| 7,149,654 B2 | 12/2006 | Ramsdale et al. |
| 7,400,283 B1 | 7/2008 | Zhu |
| 7,403,580 B2 | 7/2008 | Ishii et al. |
| 7,432,836 B2 | 10/2008 | Games |
| 7,663,520 B2 | 2/2010 | Sugihara et al. |
| 7,667,631 B1 | 2/2010 | Zhu |
| 7,817,070 B2 | 10/2010 | Games |
| 2003/0233954 A1 | 12/2003 | Frank et al. |
| 2004/0027118 A1 | 2/2004 | Lenz et al. |
| 2004/0027263 A1 | 2/2004 | Pailleur et al. |
| 2008/0316079 A1 | 12/2008 | Games |

FOREIGN PATENT DOCUMENTS

| | | |
|---|---|---|
| JP | 200660721 | 3/2006 |
| WO | 8503586 A1 | 8/1985 |

* cited by examiner

MULTIPLEXED SIGNAL SAMPLER AND CONDITIONER

BACKGROUND OF THE INVENTION

The present invention relates generally to a signal conditioning topology which is consistent with a methodology for converting multiple types of inputs including AC sensor signals to equivalent engineering units.

Although this invention is not limited to LVDTs or resolvers, these sensors will be used as examples to describe the operation and some of the benefits of the present invention. LVDTs and resolvers each generate a pair of AC sensor signals that together indicate position and/or angle. These AC sensor signals must be converted to their equivalent engineering units. Signal conditioning methods include separate antialiasing filter and demodulators for each of the AC sensor signals. This increases the cost, size and power consumption of the circuit. Additionally, signal condition methods include multiple signals that are not sampled simultaneously due to being fed through a common multiplexer, introducing a time skew error into the signal processing. For applications where AC sensors require multiple signals to compute position such as LVDTs and resolvers and the position may change rapidly, it is advantageous to have an efficient, cost effective means to sample the sensor's signal outputs within the same timeframe such that position slewing errors are eliminated.

SUMMARY OF THE INVENTION

A signal convertor includes a first sensor configured to generate a first signal and a second signal and first and second multiplexers configured receive the first and second signals, respectively, and generate samples. The signal convertor also includes an analog-to-digital (A/D) convertor configured to convert the samples and a processor configured to multiply the samples by a sine vector and by a cosine vector and determine a magnitude of the first and second signals based upon the product of the samples and the sine vector and the product of the samples and the cosine vector.

A method for converting a signal includes the steps of a) providing first and second signals from a sensor to first and second multiplexers, respectively, b) multiplying samples from the first and second multiplexers by a sine vector, c) multiplying samples from the first and second multiplexers by a cosine vector, d) determining the magnitude of the first and second signals based upon steps b) and c), and e) determining a mechanical angle of the first and second signals based upon steps b) and c).

BRIEF DESCRIPTION OF THE DRAWINGS

Other advantages of the present invention will be readily appreciated as the same becomes better understood by reference to the following detailed description when considered in connection with the accompanying drawings wherein.

DETAILED DESCRIPTION

Figure 1:
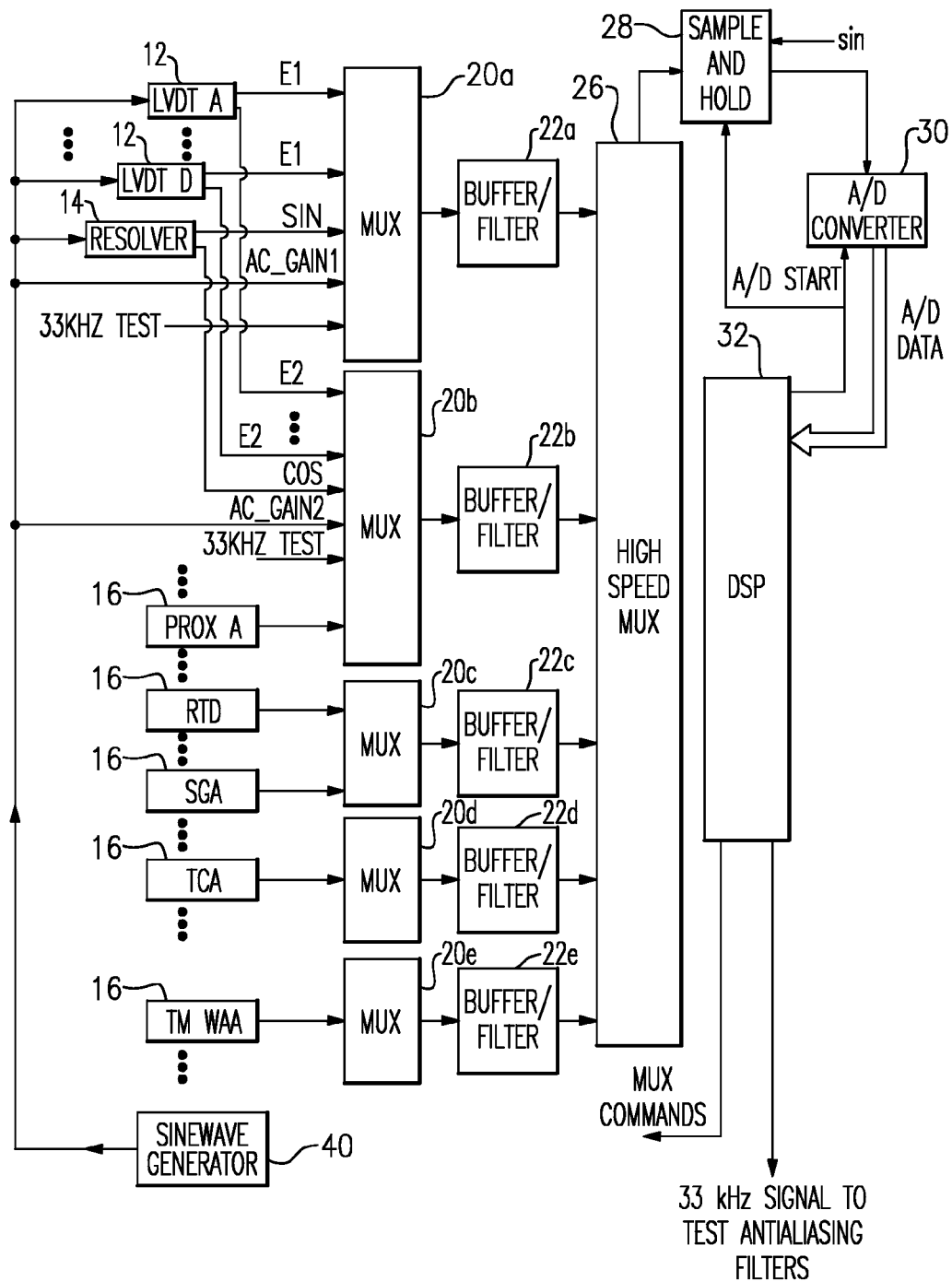
FIG. 1 is schematic of the signal conditioning circuit of the present invention.

A signal conditioner 10 for a plurality of input signals from a plurality of sensors 12, 14, 16 is shown in FIG. 1. The sensors may include sensors generating alternating current (AC) input signals, such as LVDTs 12, resolvers 14 and other sensors 16 as shown, such as proximity sensors, etc. Baseband (DC) signal generating sensors could also be used with the multiplexed system such as thermocouples (TC's) and resistance temperature devices (RTD's).

A plurality of first tier multiplexers 20a-e each group a plurality of input signals into a shared antialiasing filter 22a-e. The plurality of input signals for any given first tier multiplexer 20a-e is preferably sufficiently similar such that a single antialiasing filter 22a-e can be used. For multiple AC input signals from a single sensor, for example five-wire LVDTs 12 (E1 and E2) and resolvers 14 (A sine β and A cosine β windings), signals from the same sensor are fed through separate first tier multiplexers 20a, 20b and antialiasing filters 22a, 22b, respectively. This is done so that the signals E1 and E2 or A sine β ("sin") and A cosine β ("cos") can be sampled nearly simultaneously to eliminate any error introduced by a time skew when the LDVTs 12 or resolvers 14 positions' are changing. Sampling E1 and E2 (or resolver signals) nearly simultaneously promotes concurrent settling of multiplexers 20a and 20b and antialiasing filters 22a and 22b and a digital filter (if used) since the LVDT 12 (or resolver 14 signals) E1 and E2 signals are nearly in phase. The concurrent settling of the two E1 and E2 (or resolver 14 signals) paths optimizes the overall settling time and improves conversion throughput. The effect of sampling E1 and E2 (or resolver 14 signals) within the same timeframe is also beneficial for periodic amplitude variation or noise that is present on both E1 and E2 especially if introduced as a result of the LVDT 12 (or resolver 14) AC excitation source.

To correct for any error introduced by the use of separate multiplexers 20a, 20b and filters 22a, 22b, a common AC gain signal (AC_GAIN 1 and AC_GAIN 2) is used to "gain compensate" each signal path. The AC gain signals are driven from LVDT 12 or resolver 14 AC excitation.

The number of sensors that can share a single first tier multiplexer 20a-e depends on the throughput requirement for the sensors and their respective conversion times. For LVDTs 12, for example, if the desired update rate was 10 msec and conversion takes 1 msec for E1 or E2, then five LVDTs 12 could be grouped into a common antialiasing filter 22a-e. However, if gain and test inputs are used as shown, then four LVDTs 12 could be grouped.

The second tier multiplexer 26 selects its inputs from the outputs of the first tier multiplexers 20a-e. The output of the second tier multiplexer 26 feeds a sample and hold circuit 28. The output of the sample and hold circuit 28 is digitized by a high speed A/D converter 30. For example, the A/D converter 30 could provide a fourteen bit digitized output in two microseconds (500 kHz). The number of first tier multiplexers 20*a-e* (and/or optionally direct inputs from a single sensor and antialiasing filter) that can be handled by the second tier multiplexer 26 during the dwell time of the first tier multiplexers 20*a-e*, is dependant on the second tier multiplexer 26 settling time and the A/D converter 30 update rate. For example, if the first tier multiplexer 20 dwell time is 1 msec, the second tier multiplexer 26 settling time is 2 microseconds, and the conversion rate is 500 kHz, 250 conversions could be done. However, this does not necessarily mean that 250 signals can be converted each millisecond, since subsequent digital filtering of the A/D converter 30 output typically requires from 8 to 36 samples of input data. This reduces the signals converted per msec to be between 6 to 32 signals.

The A/D converter 30 output is provided to the controller, which in the example shown is a DSP 32. The controller could also be a gate array, general-purpose processor, etc. Software in the DSP 32 provides the digital filtering as well as the EUC conversion. Some of the details of this digital processing will be discussed in more detail below.

The AC sensors (LVDTs 12, resolvers 14 and other sensors 16) and the sample and hold circuit 28 are preferably all synchronously operated by the same sine wave generator 40 (or other clock). More specifically, the sampling frequency is preferably an integer multiple of the frequency of the AC sensors. As will be described later, opting to sample each of the AC input signals at a frequency that is twelve times the frequency of the AC input signals simplifies some calculations, and is therefore advantageous, although not required.

Figure 2A:
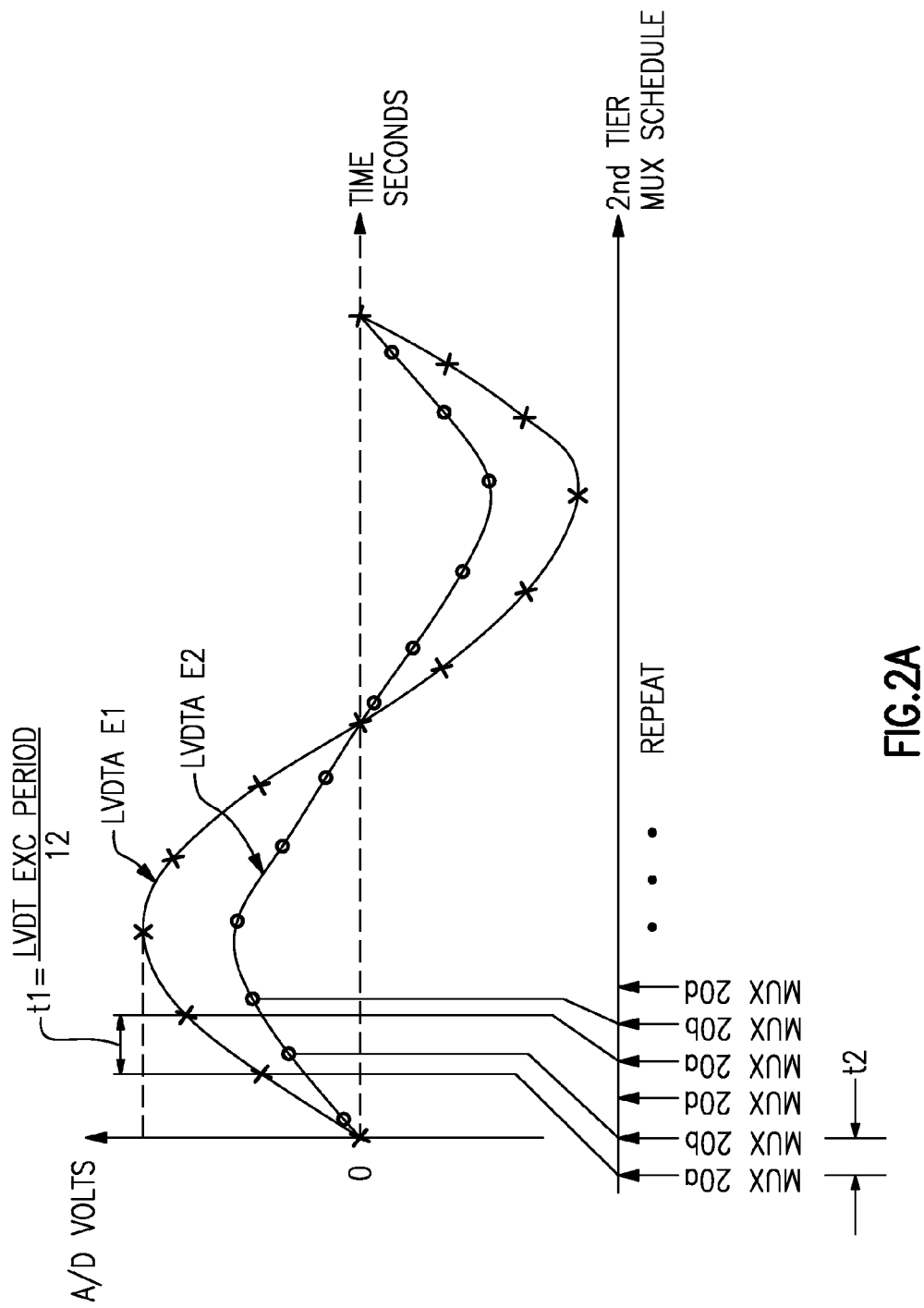
FIG. 2a is a graph showing the timing of the second tier multiplexer relative to one period of a sample AC input signal.

FIG. 2*a* illustrates a graph of one period of a sample AC input signal showing the timing of the sampling of three sensors via three different first tier multiplexers 20. In the example of FIG. 2*a*, first tier multiplexers 20*a*, and 20*b* sample signals E1 and E2 from LVDT A, respectively. First tier multiplexer 20*d* chooses to sample input signals from thermocouple A (TC A) in this example, however, in another example, input signals from another source can be sampled. In the case illustrated, the first two signals being sampled are sine waves, such as 3 kHz sine waves like those typically provided by the LVDTs 12 or resolvers 14. The sample and hold circuit 28 and the second tier multiplexer 26 sample each AC input signal (i.e. each first tier multiplexer 20) at a period of $t_1$ seconds which corresponds to a sample rate of 36 kHz assuming a 3 Khz sinewave excitation, thereby producing twelve samples per cycle per sensor. The time offset or A/D conversion time between sampling E1 and E2 ($t_2$) at multiplexers 20*a*, 20*b*, respectively, can be, for example, 2 microseconds. A very short time offset $t_2$ can be used because signals from the same LVDT 12 or resolver 14 (E1 and E2 or A sine β and A cosine β) are fed to separate multiplexers 20*a*, 20*b*, respectively as was discussed above. The second tier multiplexer 26 time-shares the sample and hold circuit 28 and A/D converter 30 between multiple sine wave sources (in this case, between the multiple first tier multiplexers 20*a-e* and their associated antialiasing filters 22*a-e*) in the time interval between 36 kHz samples (27.778 microseconds).

Figure 2B:
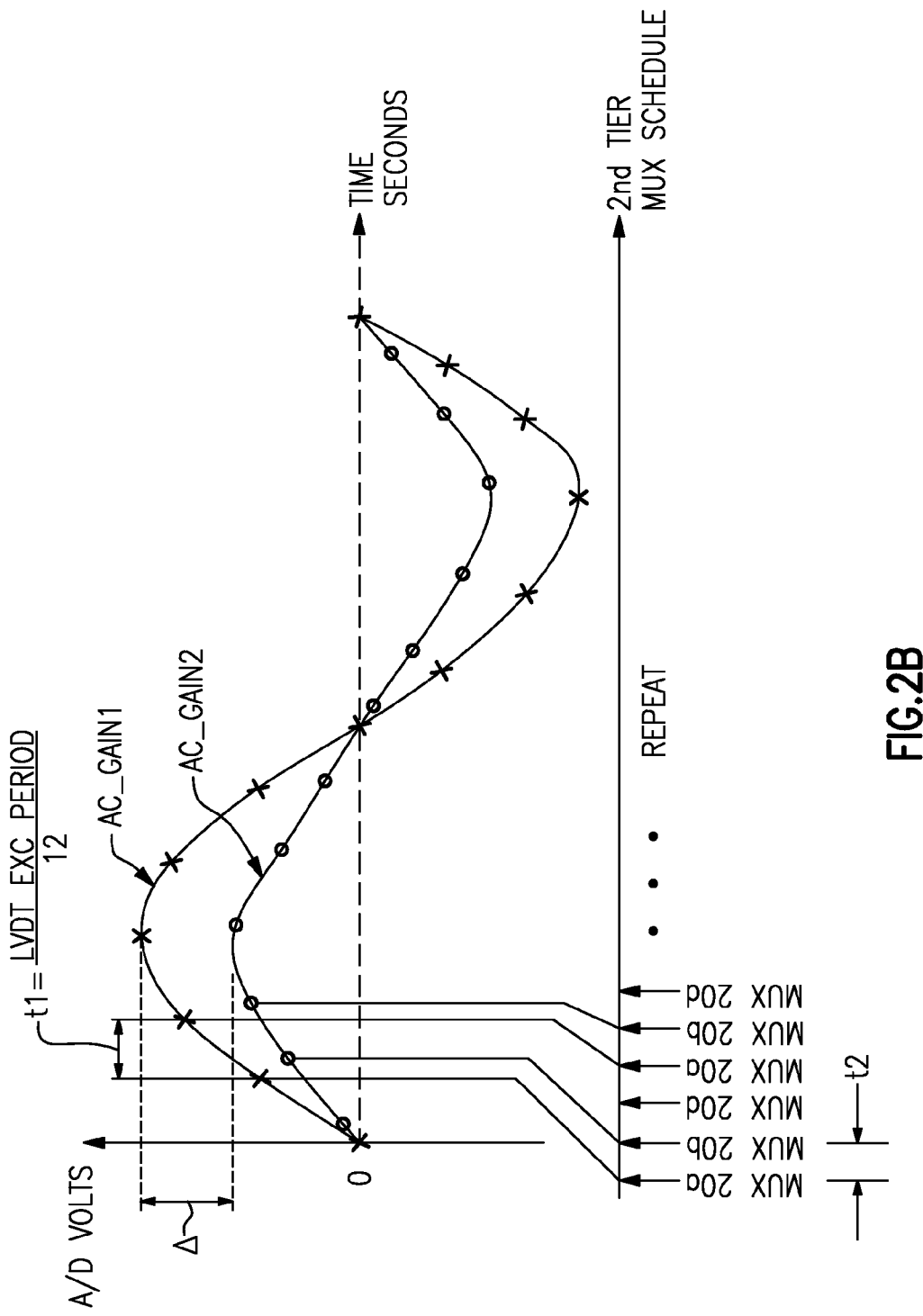
FIG. 2b is a graph showing the timing of the second tier multiplexer relative to one period of a sample AC gain compensation signal.

FIG. 2*b* illustrates a graph of one period of sample AC gain signals via three different first tier multiplexers 20*a*, 20*b*, 20*d*. In this example, multiplexers 20*a*, 20*b* sample AC_GAIN1 and AC_GAIN2 signals, respectively. The difference A between the amplitude of the AC_GAIN1 and AC_GAIN2 signals is due to error stemming from the signals flowing though different antialiasing filters 22*a*, 22*b*, respectively (FIG. 1). This error changes very slowly and is primarily dependent on the temperature of the electronic circuitry.

Therefore, in one example, AC_GAIN1 and AC_GAIN2 processing may be scheduled to be sampled on a different timeframe than the LVDT 12 E1 and E2 signals. In one example, the LVDT 12 E1 and E2 sampling timeframes are scheduled every 24 milliseconds while the AC_GAIN1 and AC_GAIN2 signals are scheduled according to the expected rate of change of the circuitry temperature, for instance, every 1000 milliseconds. In other applications, the LVDT 12 E1 and E2 and AG_GAIN1 and AC_GAIN2 can be scheduled once during initialization or scheduled at the same update rate as E1 and E2 (24 ms in this example).

Assuming the A/D converter 30 is capable of converting at a 500 kHz rate, and the second tier multiplexer settling time is 2 microseconds, six input signals could be concurrently sampled in the 27.7 microseconds. The dwell time on the first tier multiplexer 20*a-e* is dependent on the signal type antialiasing filter 22*a-e* settling time, and the digital filtering required. For example, for AC signals the filter settling time is approximately 0.165 msec, and a minimum of 12 samples of the signal are required for one complete cycle of the input wave. This makes the minimum dwell time 0.5 msec. Addition of recommended digital low pass filters increases this number of samples to typically 30, making the dwell time 1 millisecond. Using the above numbers six simultaneous waves could be converted every 0.5 milliseconds or every 1 millisecond, without and with digital filtering respectively. Assuming the average update rate required for the AC signals was 10 msec, 120 or 60 (without and with digital filtering respectively) AC signals could be converted at this average rate by one A/D converter 30. In the example illustrated in FIG. 2, the second tier multiplexer 26 is sequentially switching through the outputs of the first tier multiplexer 20*a*, first tier multiplexer 20*b* and first tier multiplexer 20*d* within each sample period (27.778 microseconds), such that each first tier multiplexer 20*a*, 20*b*, 20*d* is sampled for 0.5 or 1 msec, dependent on digital filtering requirements.

As mentioned above the settling time for each first tier multiplexer 20*a-e* and its associated antialiasing filter 22*a-e* must be accommodated before usable samples are obtained. This delay is to allow steady state conditions to be achieved before samples that will be used are taken. The delay is determined by the multiplexer delay and the antialiasing filter 22*a-e* settling time constant. The amount of filtering required is dependent on the expected magnitude of any potential input frequency which might alias a signal frequency within the signal conditioner pass band. The usable samples (in this example, twelve to thirty) of the AC input signal are then processed to determine the magnitude (and phase for four quadrant resolvers 14) of the AC input signal.

It will become clear in future discussions that the signal processing algorithm for the AC signals, implemented by the DSP 32 produces a bandpass filter centered around the frequency of the AC input signals. Depending upon the frequency of the input signal and the sample rate, an alias signal could be produced that is within the pass band of the bandpass filter. The antialiasing filters 22*a-e* are chosen to eliminate (or substantially reduce) the magnitude of input signals that could produce this aliased signal. The signal at 11X the excitation frequency is typically the worst case since it will produce an aliased signal precisely at 3 kHz. Higher frequency signal (e.g. 13*x*) can also produce beat notes. However, since an antialiasing filter is characteristically implemented by using a multiple pole low pass filter; if it is designed to adequately attenuate the lowest frequency that could produce an aliased signal, the filter will also take care of other higher frequency signals that could produce an undesired aliased signal. The specific antialiasing filter requirements would be based upon the magnitude of the potential aliased signal in a particular application, and the errors permitted for the signal conditioner.

The antialiasing filters 22a-e provide a settling time that reduces the throughput of the signal conditioner 10, as has been described above, since the A/D converter 30 will not produce valid data until steady state has been reached. This effect can be mitigated if the throughput loss becomes significant by adjusting the timing of the first tier multiplexer 20 so that the second tier multiplexer 26 is sampling a different antialiasing filter 22a-e which has already settled while the antialiasing filter 22a-e in question is settling.

After the stabilized samples are collected, digital processing is performed. Two cases will be considered. The first case is where there is no requirement for digital low pass filtering. In this case the digitized AC input signal (e.g. the twelve post-settling samples) is sine wave synchronously demodulated by the DSP 32. This is done by multiplying the sampled input vector by the value of the sine and cosine vectors (at 30-degree increments) for one complete cycle. The sine and cosine synchronous demodulation allows even as well as odd harmonics to be eliminated in the processed digital signal. The output of the sine (and cosine) synchronous demodulator is summed to produce an output which is six times the peak sine wave input. (This is because the synchronous demodulation process produces an output that is ½ the input peak magnitude, and twelve samples are taken). Note both a sine and a cosine synchronous demodulation process is provided so that phase shift errors due to timing skew of the sampler and the sampled signal will not cause conversion errors. The resultant sine and cosine components are vector summed by the DSP 32 to produce the magnitude of the input wave. The update rate of this calculation is only 1/12 the input A/D rates however, so the DSP 32 burden is thereby reduced.

Figure 3:
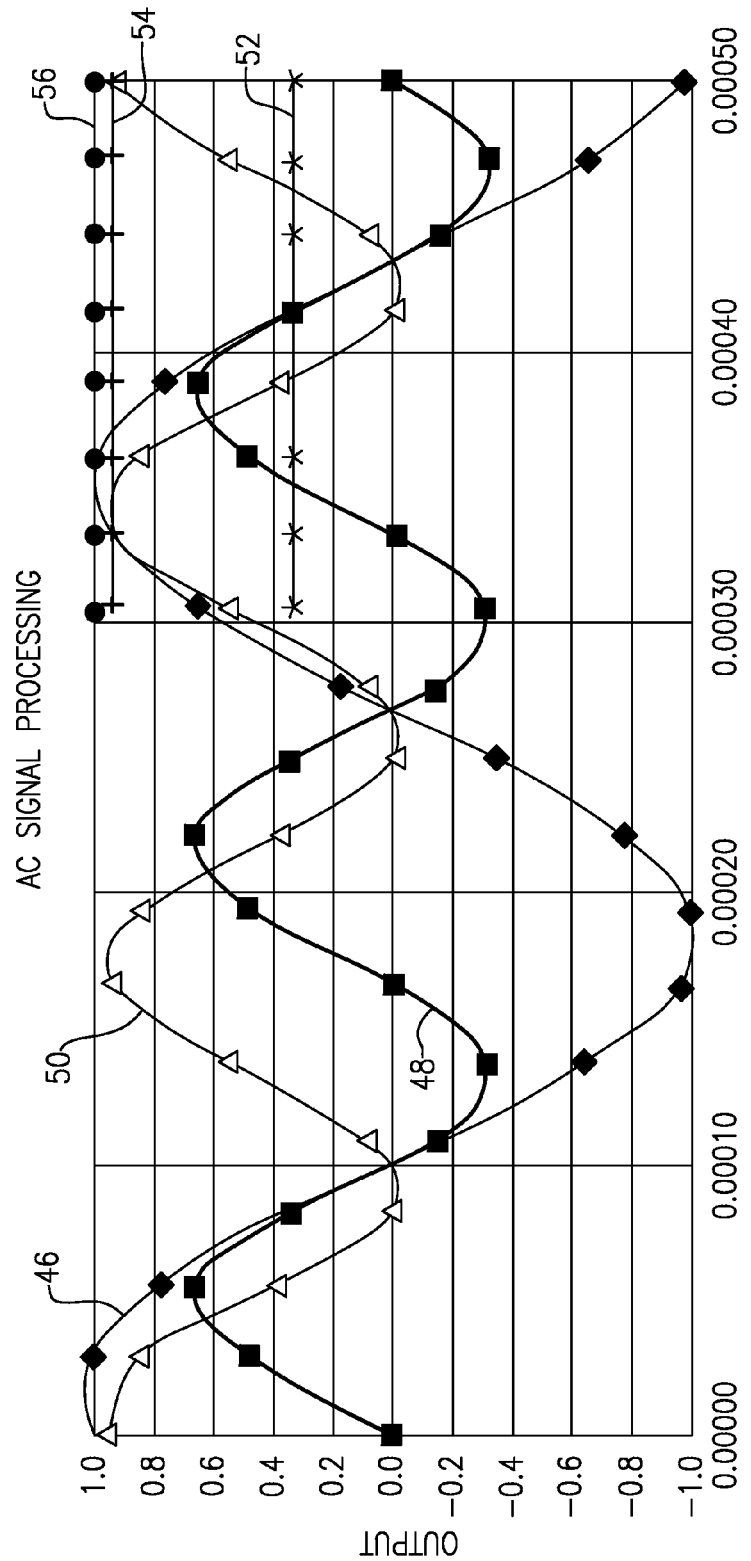
FIG. 3 is a graph of a sample conversion.

An example calculation is illustrated in FIG. 3 for an input 46 with a magnitude of one. The samples of the input 46 (after the settling time) are multiplied by the sin table values to yield the input*sin product 48 and by the cos table values to yield the input*cos product 50. The average sin 52 and average cos 54 divided by 6 are vector summed to yield the magnitude 56 of the input 46 (one).

Choosing twelve samples per cycle simplifies the sine and cosine multiplication. All of the multiplication can be accomplished by binary shifts or are zero, except the sin 60 (120, 240, 300) or the cos of 30 (150, 210, 330) which equal SQRT3/2. This can be accurately approximated with shift and add operations, thereby eliminating the need for an ALU to provide the desired mathematical operations. Alternatively, the mathematical operations could be provided in an ALU or otherwise in the controller.

Figure 4:
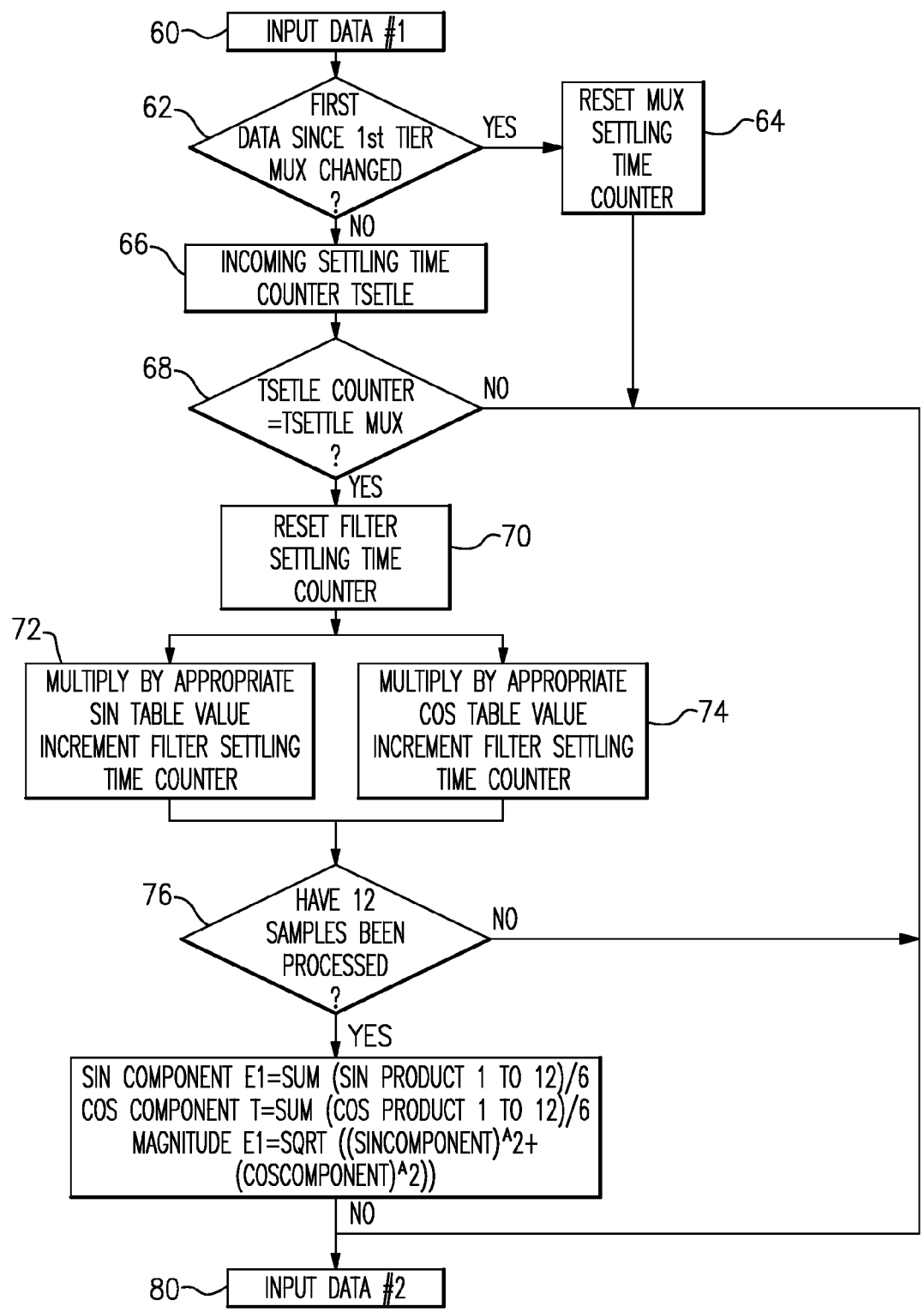
FIG. 4 is a flowchart of the operation of the AC signal conditioner.

FIG. 4 illustrates the signal processing for a typical AC input signal from an LVDT 12, for example E1. The first sample is input in step 60. A settling time counter, operated in steps 62 to 70, allows sufficient time for the first tier multiplexer 20, as well as the antialiasing filter 22 to reach steady state. Stored sine and cosine tables in steps 72 and 74 then multiply the sample, respectively, which contain the values for every 30-degree increment. The skew of this table with the zero crossing of the input excitation to an LVDT 12 is not important, but for resolvers 14 the start of this sine cosine sequence should be roughly aligned with the excitation zero crossing. When twelve products have been accumulated (step 76), they are added, and divided by six to obtain the resolved sine and cosine components of the input vector E1 in step 78. The magnitude of E1 can then be computed as shown from the calculated resolved vector components. Additional data is input in step 80.

To better understand the mathematics behind this algorithm, the following general equations are provided:

$$A \sin(f(t))\sin(\omega t) = A(½ \cos(f(t)-\omega t) - ½ \cos(f(t)+\omega t)) \quad (1)$$

$$A \sin(f(t))\cos(\omega t) = A(½ \sin(f(t)-\omega t) + ½ \sin(f(t)+\omega)) \quad (2)$$

Where f(t)=LVDT or Resolver input voltage

As can be seen, the multiplication yields sum and difference frequency outputs.

Evaluating the simplistic case where $2\pi*f(t)$ and $\omega t$ are identical, except for a phase shift ($\alpha$) between the two, the above equations yield time invariant resolved outputs of the input magnitude A plus a sum frequency component.

$$A \sin(f(t)+\alpha)\sin(\omega t) = A(½ \cos(\alpha) - ½ \cos(f(t)+\omega t)+\alpha) \quad (1)$$

$$A \sin(f(t)+\alpha)\cos(\omega t) = A(½ \sin(\alpha) + ½ \sin(f(t)+\omega t)+\alpha) \quad (2)$$

The sine and cosine products are a function of the electrical phase relationship $\alpha$ between the LVDT 12 excitation and the E1 or E2 outputs. The sum frequency is removed by averaging the sampled outputs over precisely one period of the input signal for the non digitally filtered case as illustrated in FIG. 3. Note there is a scale factor of ½ in these equations. Therefore the average is computed by dividing by six instead of twelve. Finally the vector magnitude of E1 can be determined by the square root of the sum of the squares of the sine and cosine vector components. E2 conversion is done in a similar manner.

The characteristic Equation of the EUC conversion for a five wire LVDT is as follows:

Position=(LVDT Gain)*{(E1-E2)/(E1+E2)}+LVDT Bias

Where LVDT Gain and LVDT Bias terms are LVDT characteristics provided by the manufacturer, and E1 and E2 are determined per FIG. 4.

As can be seen by the above equations, interface gain errors and LVDT excitation magnitude variations would cancel. (This fact allows small errors in antialiasing filter gain due to non-perfect settling to cancel as well, as has been mentioned previously).

The same analysis described above with respect to FIGS. 4 and 4a applies to computing the vector magnitude of the AC gain compensation signals AC_GAIN1 and AC_GAIN2.

A four-quadrant resolver 14 can also be converted. A single quadrant conversion is a subset of this logic, and is not covered in any detail. The algorithm for determining the magnitude of the A sin β or A cosine β, (where β is the resolver angle) windings is virtually identical to that logic used for calculating E1 and E2 for the LVDTs 12, with one exception. The A sin β or A cos β outputs must be properly signed, since the arctan function that is used to convert the ratio A sin β/A cos β to the angle β angle repeats itself over 360 degrees of travel This sign determining logic is as follows:

Sin component*A sin β=Sum(sin product 1 to 12)/6

Cos component*A sin β=Sum(cos product 1 to 12)/6

If Sin component*sin β>0,sign of A sin β=+,else sign of A sin β=−,Magnitude Sin β=SQRT((Sin component A sin β)²+(Cos component A sin β)²)Cos ω conversion is done in a similar manner.

This logic requires some rough time synchronization to be done in the starting point of the sine cosine table, and the excitation zero crossing. As phase shift occurs with imperfect time synchronization, the sensitivity of the sine component starts to diminish; however the zero crossing point is still maintained.

When LVDT 12 E1 and E2 are computed as discussed above with respect to FIGS. 4 and 4a, compensation for the addition of the AC gain signal is required. The vector magnitude of compensated E2 is calculated as Compensated $E2 = E2*(AC\_GAIN1/AC\_GAIN2)$ Where AC_GAIN1 and AC_GAIN2 are vector magnitudes calculated as was described above The vector magnitude of E1 can remain uncompensated since E2 is effectively normalized to the E1 gain path. The same gain compensation can be applied to an A cos β signal from a resolver 14. Again, the A sin β does not need to be compensated since the A cos β signal path is effectively normalized to the A sin β path.

The final LVDT 12 or resolver 14 position calculation described above is performed using the gain-compensated values. For example, the LVDT 12 position is calculated as:

Position=$(LVDT\ Gain)*\{(E1-Compensated\ E2)/(E1+Compensated\ E2)\}+LVDT$ Bias

Where LVDT Gain and LVDT Bias terms are LVDT characteristics provided by the manufacturer, and E1 and E2 are determined as was described above. Similarly, the final resolver EUC position calculation is performed using the A sin β signal and the compensated A cos β signal.

In one example, the AC gain signs are range-checked against their expected ranges in consideration of all component variables as an additional built-in test.

Figure 5:
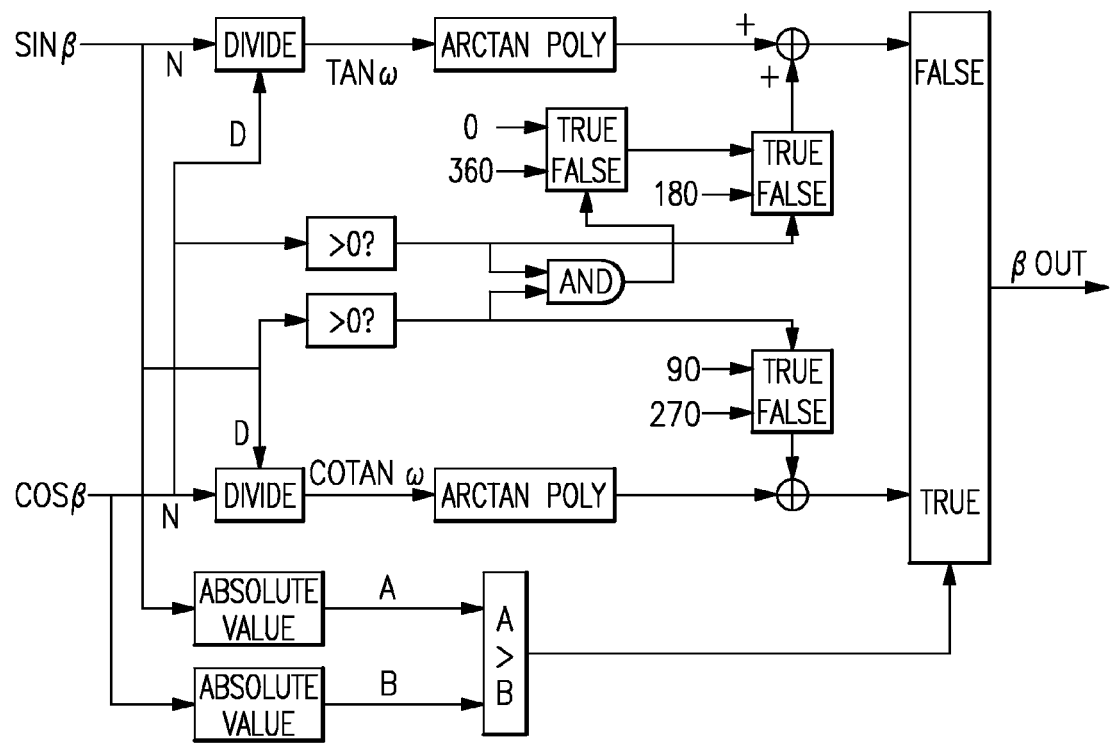
FIG. 5 is a schematic of a logic circuit for the EUC conversion for a resolver.

The EUC calculations as well as the octant logic are detailed in FIG. 5. It produces the desired 0 to 360 degree EUC. Note the conversion alternates between an arctan and an arccot function dependant on the magnitudes of the sin β and cos β. This is done to avoid the high slope regions of the arctan/arccot curves, which can introduce angular error in the equation output. Discontinuity must exist at some angle where the rotation is considered complete. That discontinuity is set at 0/360 degrees for the logic shown. The EUC equation again illustrates the cancellation of gain errors in the conversion.

Figure 4A:
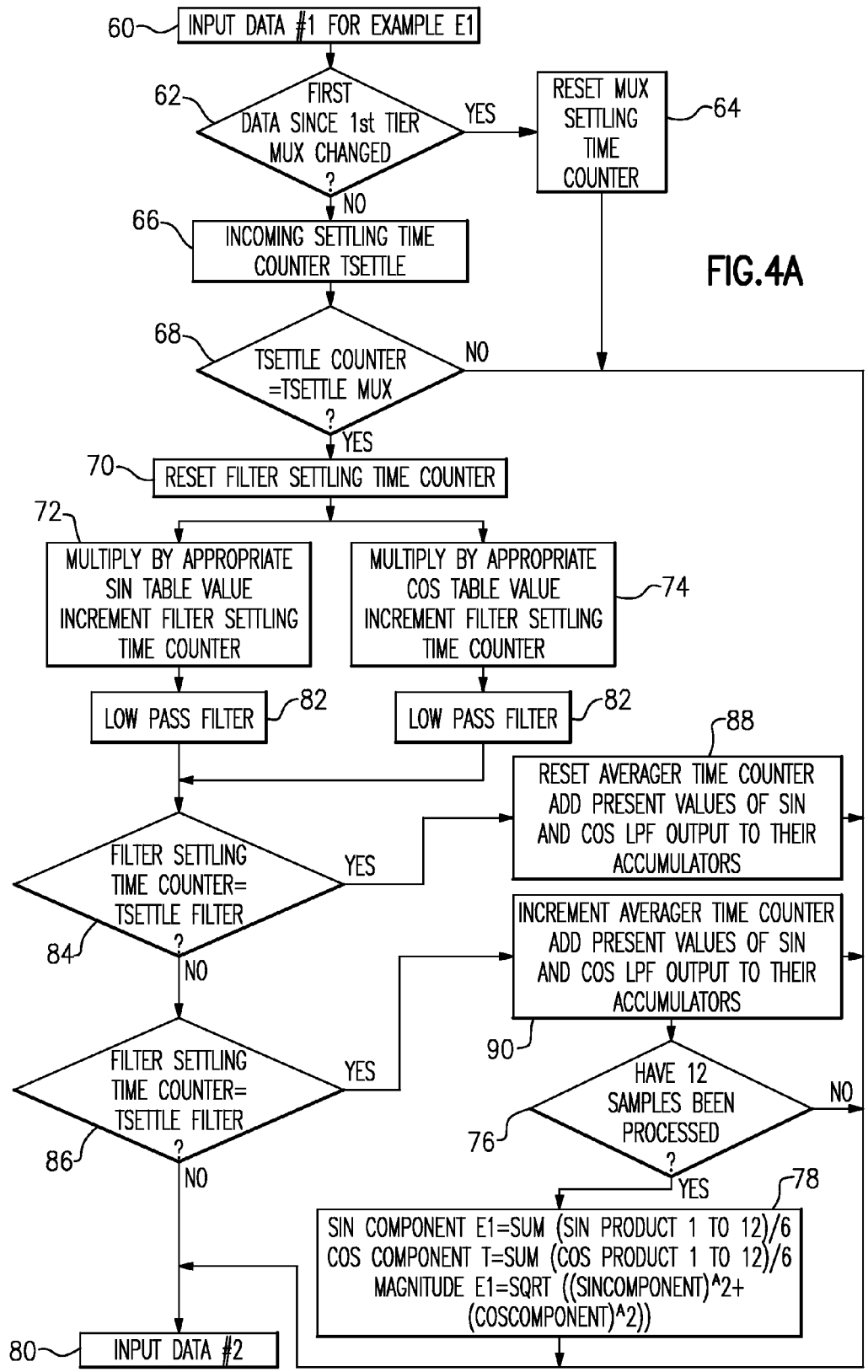
FIG. 4a is a flowchart similar to that of FIG. 4, with the addition of the digital filter.

The case of the AC conversion of E1 or E2 (or A sin β and A cos β for the resolver case) using digital filtering will next be considered. The flow chart and time domain responses will first be presented for comparison with the AC conversion without digital filtering. A comparison of the two cases will then be made in the frequency domain to illustrate the improvement in noise immunity afforded by the addition of the digital filter. FIG. 4a illustrates the additional logic required to insert the digital filter. Comparing the logic to FIG. 4 reveals two new blocks labeled Low Pass Filter 82. If the filter settling time counter equals the Tsettle filter value, then the average time counter is reset and the present values of sin and cos LPF output are added to their accumulators in step 88. If the filter settling time counter is less than the Tsettle filter value, then the average time counter is incremented and the present values of sin and cos LPF output are added to their accumulators in step 90. This accounts for the settling time of the low pass filters 22 (FIG. 1).

Figure 4B:
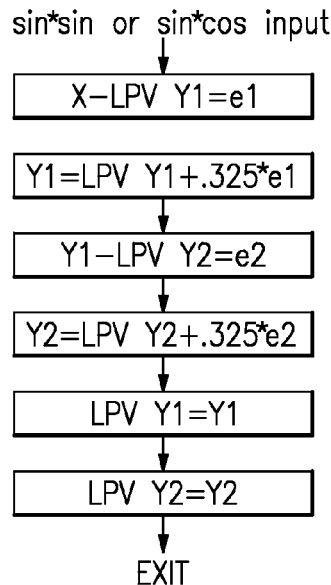
FIG. 4b illustrates one example two-pole digital filter.
Figure 4B:
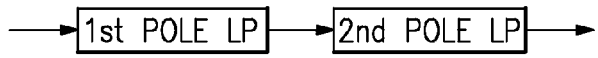
Figure 4C:
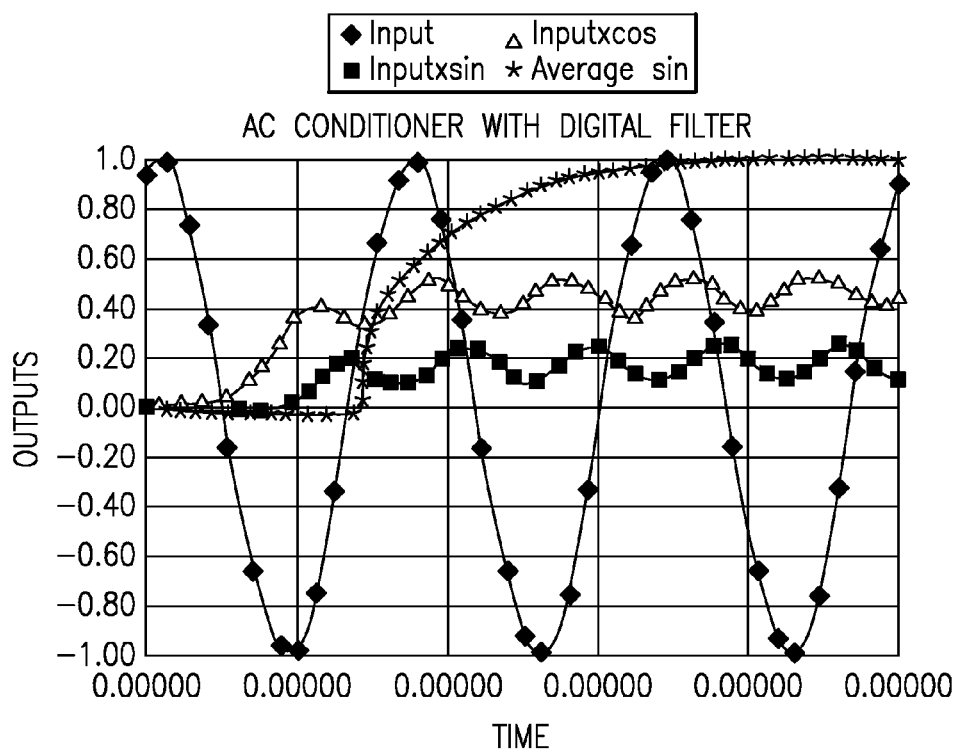
FIG. 4c graphically illustrates time domain response with filtering.

The low pass filter 22 (FIG. 1) used to demonstrate the effect for illustration is a simple two-pole LP filter generated by cascading two simple lags as illustrated in FIG. 4b. The resultant time domain response is illustrated in FIG. 4c. Comparing 4c to FIG. 3 (time domain response without digital filtering) reveals the significant reduction in magnitude of the sum frequency component, however at the expense of a longer settling time. The filter illustrated is a two-pole 1500 Hz low pass (LP) filter, and requires approximately 0.5 msecs settling time. This makes the total conversion time approximately 1 msec, versus 0.5 msec for the AC conditioner without a digital filter.

Figures 4D, 4E:
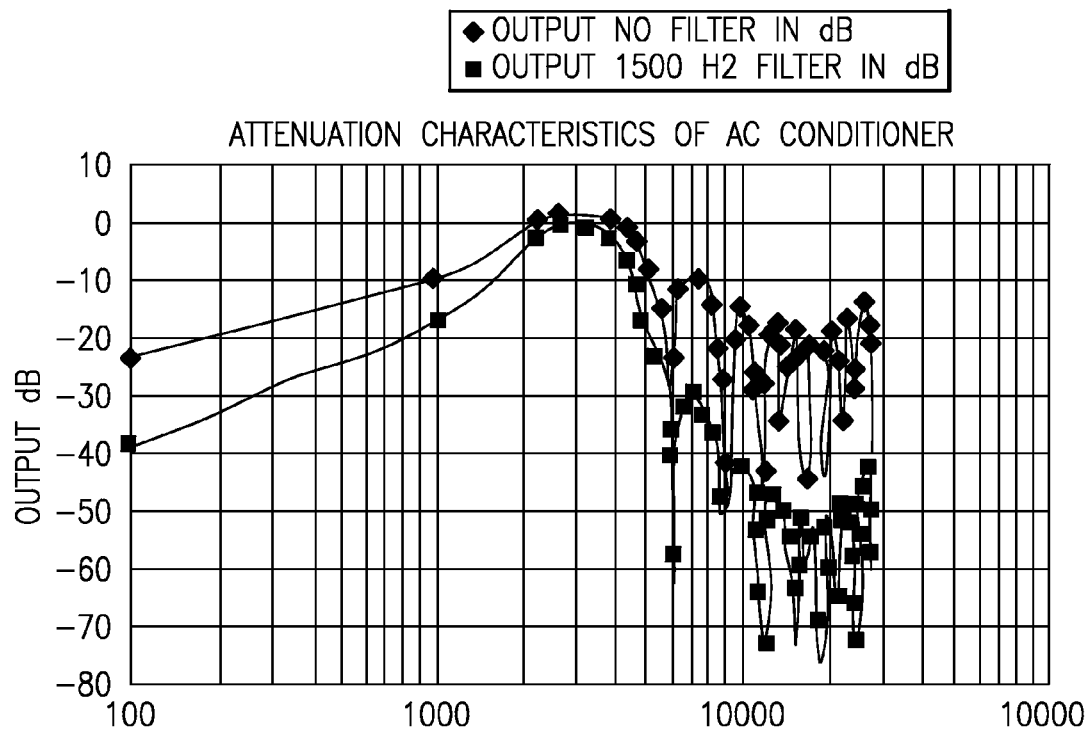
FIG. 4d illustrates a frequency response comparison for the AC conditioner both with and without a digital filter.
FIG. 4e illustrates the sin and cos multiplier tables.

The frequency response comparison for the AC conditioner, both with and without a digital filter, is illustrated in FIG. 4d. The pass band characteristics of the signal conditioner with the filter is noticeably narrower than without the filter. This results in an improved rejection of noise outside the frequency range of interest, such as might be present in an avionics environment due to electromagnetic interference (EMI) or lightning. It should also be noted from FIG. 4d, that the pass band characteristics of the AC conditioner, with or without the digital filter, results in 0 gain at DC. This fact eliminates any DC offset errors in the AC signal conditioner. This has the advantage of eliminating the need for a 0 calibrate test signal.

Figure 4F:
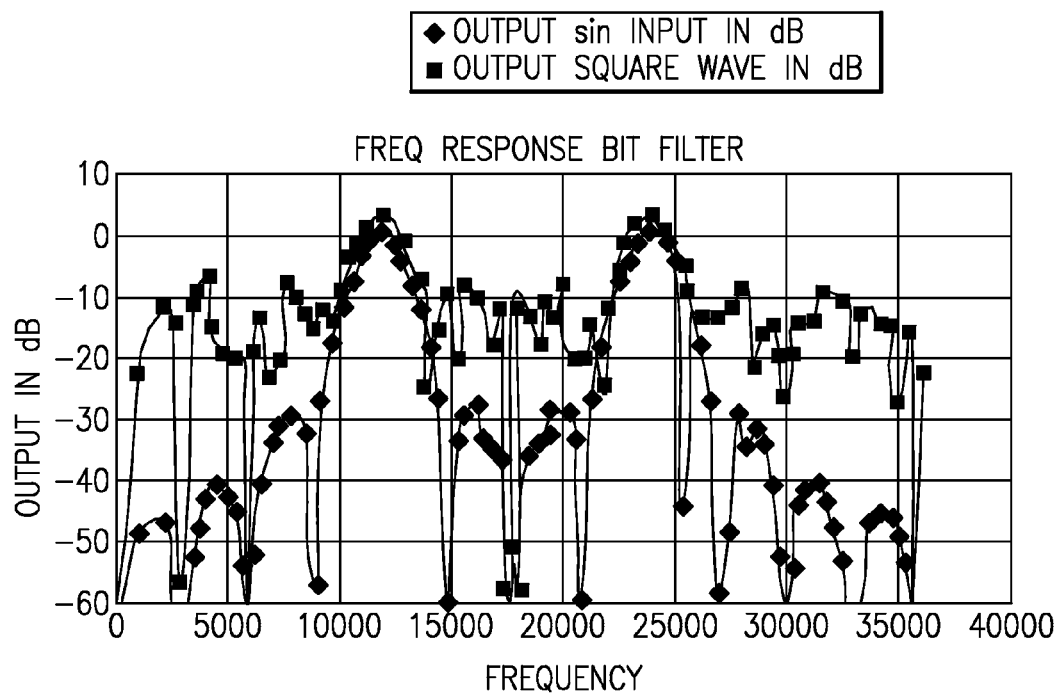
FIG. 4f illustrates the frequency response of a frequency-shifted filter.

A test signal is required, however, to verify the proper performance of the antialiasing filter for the AC conditioner. Assume the antialiasing filter is a 3-pole LP filter at 7 kHz. To properly test the attenuation characteristics of this filter, assume the test signal for the filter is set at 4 times the LVDT excitation frequency, or 12 kHz. The antialiasing filter defined should attenuate this test signal by approximately a factor of 5. However, if the digital processing of the AC conditioner were to remain unchanged, the interface would attenuate the test signal in this frequency range (see FIG. 4d), thus obscuring the antialiasing filter test. Therefore the AC conditioner processing was altered to allow the test frequency to be passed with little or no attenuation. This was done by modifying the sin and cos multiplier tables as illustrated in FIG. 4e. This change centers the digital filter pass band on 12 kHz. The frequency response of this frequency-shifted filter is illustrated in FIG. 4f. The newly generated pass band filter as illustrated in FIG. 4f also permits a square wave to be used for the test signal since it attenuates the odd harmonics. The comparison with sine versus a square wave input is also illustrated in FIG. 4f. While the removal of the undesired harmonics is not perfect, around the frequency of interest, 12 kHz, the difference between a sine and a square wave is small. Since a square wave is much easier to generate than a sine wave, this feature of the suggested implementation represents a highly desirable simplification in the BIT circuitry. The test signal is inserted at the multiplexer input, and if the antialiasing filter is working properly, its output value will be approximately 20% of the input magnitude.

Other filtering techniques such as a slew rate filter on the output can be effective in bounding the excursions of wild points. Basically the output is constrained to move only as much as the maximum slew rate of the devise would allow it to move. This type of filter is most effective when the sampling rate is high compared to the maximum slew rate, so that the maximum travel is constrained to a small value each dt.

Figure 4G:
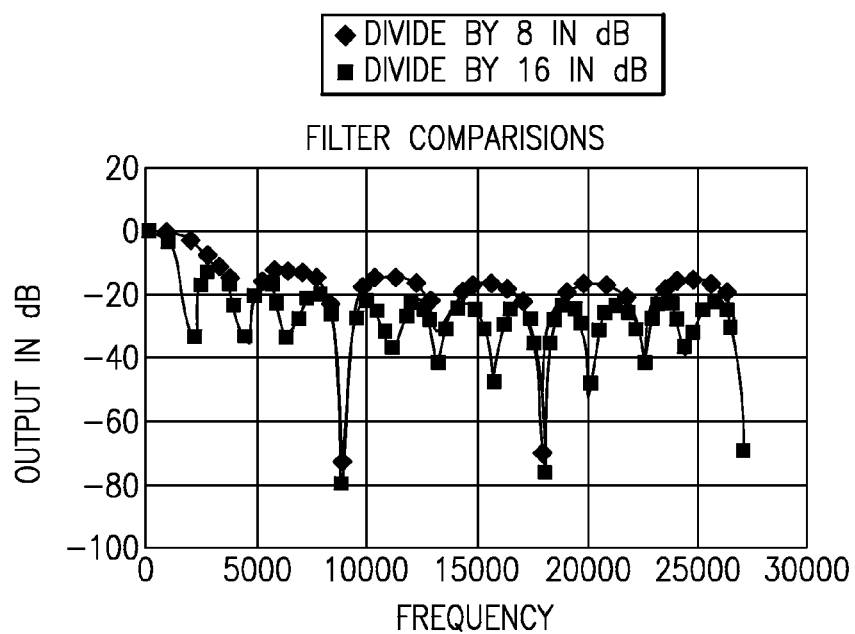
FIG. 4g illustrates the frequency response produced by averaging by 8 or 16 data samples.

Signal processing of DC (baseband) signals such as illustrated by 16 in FIG. 1 does not require the logic as illustrated in FIG. 4. However digital filtering techniques on these signals are highly desirable, and generally absolutely necessary in an avionics environment due to EMI and lightning effects. The simplest form of filtering is strictly averaging. FIG. 4g illustrates the frequency response produced by averaging by 8 or 16. An 18 to 20 dB attenuation of high frequency signals is illustrated. The throughput is of course affected since 8 or 16 data samples must be taken prior to generating an output. Other more sophisticated filter techniques, such as FIR or IIR, can be equally well applied, the tradeoff being between throughput and attenuation of undesired signals.

In accordance with the provisions of the patent statutes and jurisprudence, exemplary configurations described above are considered to represent a preferred embodiment of the invention. However, it should be noted that the invention can be practiced otherwise than as specifically illustrated and described without departing from its spirit or scope.

What is claimed is:

1. A signal convertor, comprising:
   a first sensor configured to generate a first signal and a second signal;
   first and second multiplexers configured receive the first and second signals, respectively, and generate outputs;
   an analog-to-digital (A/D) convertor configured to convert the outputs; and
   a processor configured to multiply the outputs by a sine vector and by a cosine vector and determine a magnitude of the first and second signals based upon the product of the outputs and the sine vector and the product of the outputs and the cosine vector.

2. The signal convertor of claim 1, wherein the first and second multiplexers are first tier multiplexers, and further comprising a second tier multiplexer configured to receive outputs from the first-tier multiplexers and output outputs to the A/D convertor.

3. The signal convertor of claim 1, further comprising a second sensor configured to generate a third signal, and a third multiplexer configured to receive the third signal and generate outputs.

4. The signal convertor of claim 3, further comprising a third sensor configured to generate fourth and fifth signals, the fourth and fifth signals received by the first and second multiplexers, respectively.

5. The signal convertor of claim 1, further comprising an antialiasing filter configured to condition the outputs.

6. The signal convertor of claim 1, further comprising first and second equivalent alternating current (AC) gain signals received by the first and second multiplexers for compensating the first and second signals, respectively.

7. The signal convertor of claim 6, wherein the first and second AC gain signals are sampled on a different time frame than the first and second signals from the sensor.

8. The signal convertor of claim 7, wherein the time frame for sampling the first and second AC gain signals is dependent on a rate of change of a temperature of the signal convertor.

9. The signal convertor of claim 6, wherein the magnitude of the second signal is processed to compensate for a mismatch between signal conditioning paths of the first and second signals due to the first and second AC gain signals by multiplying by a ratio of a magnitude of the first AC gain signal to a magnitude of the second AC gain signal.

10. The signal convertor of claim 1, wherein the first sensor is a resolver, and an excitation of the resolver is synchronized with the A/D convertor.

11. A method for converting a signal, comprising the steps of:
   a) providing first and second signals from a sensor to first and second multiplexers, respectively;
   b) multiplying outputs from the first and second multiplexers by a sine vector;
   c) multiplying outputs from the first and second multiplexers by a cosine vector;
   d) determining the magnitude of the first and second signals based upon steps b) and c); and
   e) determining a mechanical angle of the first and second signals based upon step b).

12. The method of claim 11, wherein step d) further includes the steps of calculating a root mean square of an average of the products from said step b) and of an average of the products in step c).

13. The method of claim 11, further comprising the step of:
   e) providing first and second equivalent alternating current (AC) gain compensation signals to the first and second multiplexers, respectively, for compensating the first and second signals.

14. The method of claim 13, further comprising the steps of:
   f) multiplying outputs of the AC gain signals from the first and second multiplexers, respectively, by a sine wave and by a cosine wave;
   g) determining a magnitude of the first and second AC gain signals based upon step f); and
   h) compensating the magnitude of the second signal by multiplying by a ratio of the magnitude of the first AC gain signal to the magnitude of the second AC gain signal.

15. The method of claim 14, further comprising the step of:
   i) determining a position of the sensor using the compensated magnitude of the second signal.

16. The signal convertor of claim 1, wherein the first sensor is a five-wire LVDT.

17. The signal convertor of claim 1, wherein the first sensor is a resolver.

18. The signal convertor of claim 1, wherein the first and second signals are sampled almost simultaneously.

19. The signal convertor of claim 5, wherein the antialiasing filter is a first antialiasing filter that receives outputs from the first multiplexer.

20. The signal convertor of claim 1, further comprising a second antialiasing filter that receives outputs from the second multiplexer.

* * * * *